(12) United States Patent
Liang et al.

(10) Patent No.: US 10,409,322 B2
(45) Date of Patent: Sep. 10, 2019

(54) CLOCK GENERATING CIRCUIT, SERIAL-PARALLEL CONVERSION CIRCUIT, AND INFORMATION PROCESSING DEVICE

(71) Applicant: FUJITSU LIMITED, Kawasaki-shi, Kanagawa (JP)

(72) Inventors: Joshua Liang, Toronto (CA); Ali Sheikholeslami, Toronto (CA); Yuuki Ogata, Kawasaki (JP); Hirotaka Tamura, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 94 days.

(21) Appl. No.: 15/884,802

(22) Filed: Jan. 31, 2018

(65) Prior Publication Data

US 2018/0224885 A1 Aug. 9, 2018

(30) Foreign Application Priority Data

Feb. 3, 2017 (JP) .................................. 2017-018948

(51) Int. Cl.
*G06F 1/12* (2006.01)
*H03K 5/01* (2006.01)
*H03K 19/23* (2006.01)
*G06F 13/12* (2006.01)
(Continued)

(52) U.S. Cl.
CPC .................. *G06F 1/12* (2013.01); *G06F 1/04* (2013.01); *G06F 13/122* (2013.01); *H03K 5/01* (2013.01);
(Continued)

(58) Field of Classification Search
CPC ..... G06F 1/12; G06F 1/14; G06F 1/10; G06F 5/06; G06F 13/1689; G06F 1/08;
(Continued)

(56) References Cited

U.S. PATENT DOCUMENTS 6,118,306 A * 9/2000 Orton .................. G01R 31/3016
327/44
7,321,248 B2 * 1/2008 Zhang .................. H03L 7/0814
327/149
(Continued)

OTHER PUBLICATIONS

Mozhgan Mansuri, et al., "Methodology for On-Chip Adaptive Jitter Minimization in Phase-Locked Loops," IEEE Transactions on Circuits and Systems II: Analog and Digital Signal Processing, vol. 50, No. 11, pp. 870-878, Nov. 2003 (9 pages).
(Continued)

*Primary Examiner* — Zahid Choudhury
(74) *Attorney, Agent, or Firm* — Fujitsu Patent Center

(57) ABSTRACT

A serial-parallel conversion circuit includes: a phase detector that outputs a first phase detection signal indicating whether a phase of a clock signal is advance or behind, a signal amplifying circuit that amplifies the first phase detection signal with a gain so as to output a second phase detection signal; a control loop that adjusts the phase of the clock signal based on the second phase detection signal; an autocorrelation circuit that generates an autocorrelation value based on the first phase detection signal and a set delay amount, and outputs an autocorrelation signal indicating the autocorrelation value; a gain adjusting circuit that adjusts the gain in such a manner that the autocorrelation value matches a target correlation value; and a delay-amount determination circuit that sets a delay amount corresponding to a peak value of an obtained autocorrelation value obtained when the autocorrelation value changes in an oscillatory manner.

20 Claims, 11 Drawing Sheets

(51) Int. Cl.
*H04L 1/20* (2006.01)
*H03L 7/093* (2006.01)
*G06F 1/04* (2006.01)
*H03L 7/08* (2006.01)
*H03L 7/081* (2006.01)
*H03K 5/00* (2006.01)

(52) U.S. Cl.
CPC .......... *H03K 19/23* (2013.01); *H03L 7/0807* (2013.01); *H03L 7/0814* (2013.01); *H03L 7/093* (2013.01); *H04L 1/205* (2013.01); *H03K 2005/00058* (2013.01)

(58) Field of Classification Search
CPC ........ G06F 1/04; G06F 1/3202; G06F 9/4825; G06F 11/0757; G06F 11/3419; G11C 7/22
See application file for complete search history.

(56) References Cited

U.S. PATENT DOCUMENTS

| | | | | |
|---|---|---|---|---|
| 2003/0058052 A1* | 3/2003 | Birk | .......................... | G06F 1/04 331/1 A |
| 2004/0252804 A1* | 12/2004 | Aoyama | ............... | H03D 13/004 375/376 |
| 2010/0329040 A1* | 12/2010 | Jeong | .................. | G11C 7/1078 365/189.05 |
| 2011/0227618 A1* | 9/2011 | Miyano | .................... | G06F 1/04 327/158 |

OTHER PUBLICATIONS

Joon-Yeong Lee, et al., "A 10-Gb/s CDR With an Adaptive Optimum Loop-Bandwidth Calibrator for Serial Communication Links," IEEE Transactions on Circuits and Systems I: Regular Papers, vol. 61, No. 8, pp. 2466-2472, Aug. 2014 (7 pages).

Hyung-Joon Jeon, et al., "A Bang-Bang Clock and Data Recovery Using Mixed Mode Adaptive Loop Gain Strategy," IEEE Journal of Solid-State Circuits, vol. 48, No. 6, pp. 1398-1415, Jun. 2013 (18 pages).

Sungchun Jang, et al., "An Optimum Loop Gain Tracking All-Digital PLL Using Autocorrelation of Bang-Bang Phase-Frequency Detection," IEEE Transactions on Circuits and Systems II, Express Briefs, vol. 62, No. 9, pp. 836-840, Sep. 2015 (5 pages).

* cited by examiner

CLOCK GENERATING CIRCUIT, SERIAL-PARALLEL CONVERSION CIRCUIT, AND INFORMATION PROCESSING DEVICE

CROSS-REFERENCE TO RELATED APPLICATION

This application is based upon and claims the benefit of priority of the prior Japanese Patent Application No. 2017-18948, filed on Feb. 3, 2017, the entire contents of which are incorporated herein by reference.

FIELD

The embodiments discussed herein are related to a clock generating circuit, a serial-parallel conversion circuit, and an information processing device.

BACKGROUND

With an increase in performance of information processing equipment, such as apparatuses and servers for communication core systems, it has been become desirable that the information processing speed of electronic apparatuses and semiconductor devices mounted in the electronic apparatuses be improved. To improve the information processing speed of semiconductor devices or the like, it is desirable that the transmission data bandwidth be made larger, and that the number of bits transmitted per unit time be increased. For example, it is desirable that a high data rate, such as 25 Gbps or 50 Gbps, be stably achieved.

The related art is disclosed in Mansuri, M, et al., "Methodology for on-chip adaptive jitter minimization in phase-locked loops," *IEEE Transactions on Circuits and Systems II: Analog and Digital Signal Processing*, vol. 50, no. 11, pp. 870, 878, November 2003; Joon-Yeong Lee, et al., "A 10-Gb/s CDR With an Adaptive Optimum Loop-Bandwidth Calibrator for Serial Communication Links," *IEEE Transactions on Circuits and Systems I: Regular Papers*, vol. 61, no. 8, pp. 2466, 2472, August 2014; Hyung-Joon Jeon, et al., "A Bang-Bang Clock and Data Recovery Using Mixed Mode Adaptive Loop Gain Strategy," *IEEE Journal of Solid-State Circuits*, vol. 48, no. 6, pp. 1398, 1415, June 2013; and Sungchun Jang, et al., "An Optimum Loop Gain Tracking All-Digital PLL Using Autocorrelation of Bang-Bang Phase-Frequency Detection," *IEEE Transactions on Circuits and Systems II*.

SUMMARY

According to an aspect of the embodiments, a serial-parallel conversion circuit includes: a determination circuit that samples an input signal which is input serially with a clock signal, determines a signal value corresponding to the input signal, and serially outputs a data signal indicating the determined signal value; a demultiplexer that outputs the data signal which is input serially in parallel; and a clock generating circuit that generates the clock signal, wherein the clock generating circuit includes: a phase detector that outputs a first phase detection signal indicating whether a phase of the clock signal is advance or behind to the data signal, a signal amplifying circuit that receives the first phase detection signal and a gain signal indicating a gain, and amplifies the first phase detection signal with the gain so as to output a second phase detection signal; a control loop that adjusts the phase of the clock signal based on the second phase detection signal, and outputs the adjustment result to the phase detector; an autocorrelation circuit that generates an autocorrelation value based on the first phase detection signal and a set delay amount, and outputs an autocorrelation signal indicating the autocorrelation value; a gain adjusting circuit that adjusts the gain in such a manner that the autocorrelation value matches a target correlation value; and a delay-amount determination circuit that sets a delay amount corresponding to a peak value of an obtained autocorrelation value obtained when the autocorrelation value changes in an oscillatory manner in accordance with a change in a delay amount by which the first phase detection signal is delayed.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
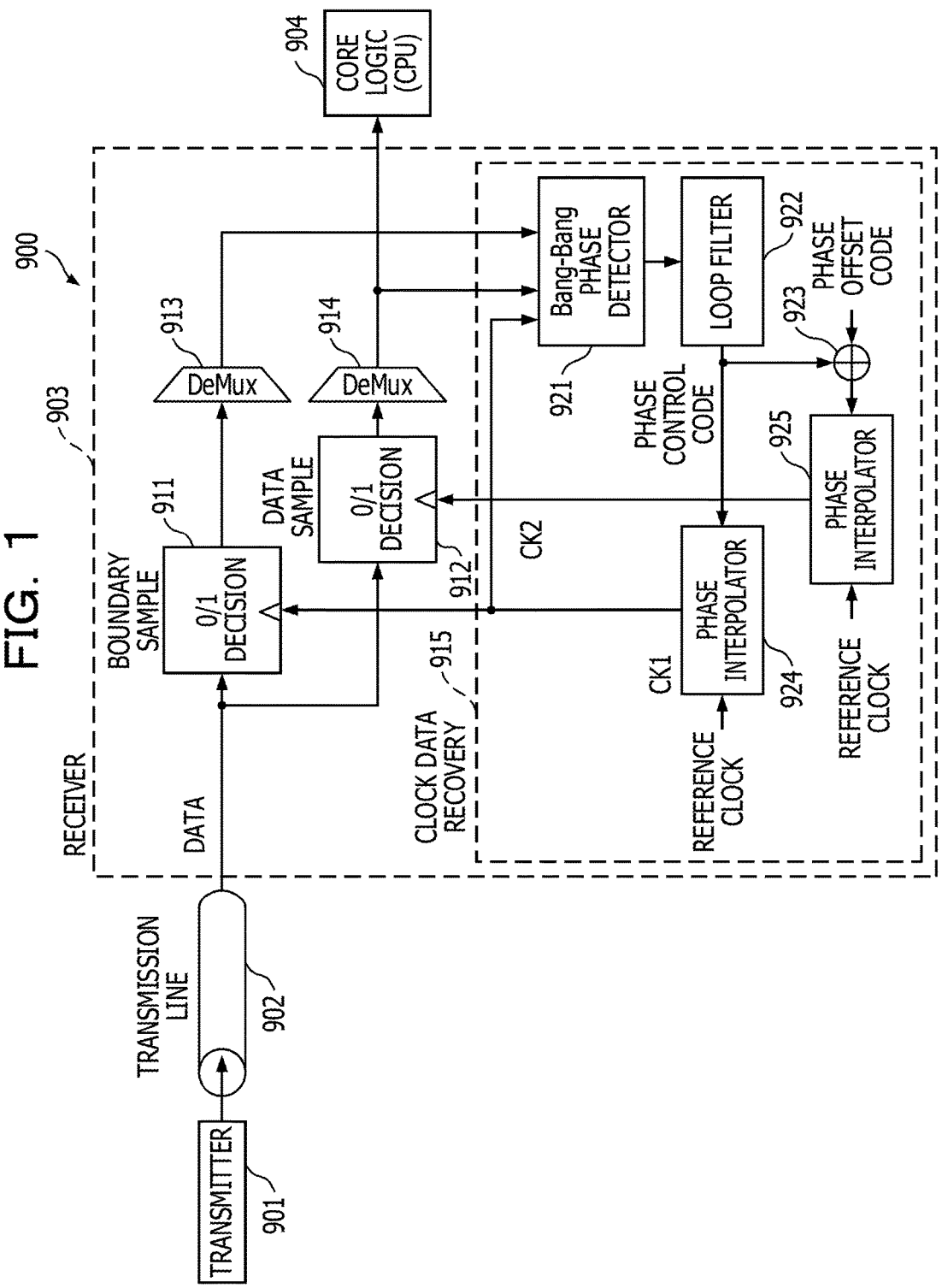
FIG. 1 is a diagram illustrating an exemplary communication system including a receiver having a bang-bang phase detector.

For example, in order to reduce the incidence of tracking errors so as to achieve a stable, high data rate, a clock used in a receiver receiving a transmission data signal is generated so as to have a good capability of tracking the transmission data signal and have low jitter. To generate a clock having a good capability of tracking a transmission data signal and having low jitter, a clock generating circuit is used. The clock generating circuit uses the phase of the transmission data signal or a reference clock as a reference phase so as to generate a clock for determining signal values corresponding to the transmission data signal. The clock generating circuit has a phase detector (PD) which compares the phase of the transmission data signal or the reference clock with the phase of the clock generated by the clock generating circuit, and which outputs a phase detection signal indicating the phase comparison result. The clock generating circuit exerts control as follows. The phase comparison result from the phase detector is fed back in a control loop so that the phase of the clock matches the phase of the transmission data signal or the reference clock. A process in which a control loop is used to recover a clock and a transmission data signal is called clock and data recovery (CDR).

As a type of phase detector, a phase detector which is also called a bang-bang phase detector outputting a one-bit binary signal indicating whether the clock phase is in the leading state or the lagging state may be used. The bang-bang phase detector has various advantages, such as a simple configuration, high compatibility with a complementary metal oxide semiconductor (CMOS) digital circuit, a capability of operating at high speed, and easy achievement of integration.

The bang-bang phase detector may be used as an all digital phase-locked loop (ADPLL) phase detector in which all components are digitized. For example, jitter caused by quantization in the ADPLL and jitter caused by random noise are reduced. For example, by adjusting the gain of a control loop, output jitter including the jitter caused by quantization and the jitter caused by random noise is minimized. For example, random noise changes in accordance with a change or the like in the process condition, the power supply voltage condition, and the temperature condition (PVT conditions) of a semiconductor device. Therefore, the optimal gain for a control loop changes in accordance with a change in the PVT conditions. When a control loop includes a digitally controlled oscillator (DCO), the DCO is easily affected by a change in the PVT conditions. Therefore, it may not be easy to adjust the gain of a control loop so that the output jitter is minimized.

For example, to optimize the gain for a control loop without being affected by a PVT change, the autocorrelation value of an autocorrelation function for the bang-bang phase detector is estimated. The gain for the control loop may be controlled based on the estimated autocorrelation value.

For example, the autocorrelation value for the bang-bang phase detector is estimated by using the output signal from the bang-bang phase detector and a delayed output signal obtained by delaying the output signal by a delay amount.

For example, when the gain for a control loop is too large, phase rotation caused by other components such as a loop filter included in the control loop causes the stability of the control loop to be degraded, and the response oscillates. If the gain is increased to such an extent that the response from the control loop is oscillatory, accuracy in data reception may be reduced.

For example, a clock generating circuit which achieves a stable, high data rate with avoidance of oscillatory response from a control loop may be provided.

FIG. 1 illustrates an exemplary communication system including a receiver having a bang-bang phase detector.

A communication system 900 includes a transmitter 901, a transmission line 902, a receiver 903, a logic circuit 904 which is, for example, a central processing unit (CPU).

The receiver 903 includes a first determination circuit 911, a second determination circuit 912, a first demultiplexer 913, a second demultiplexer 914, and a CDR circuit 915. The CDR circuit 915 includes a bang-bang phase detector 921, a loop filter 922, a phase offset circuit 923, a first phase interpolator 924, and a second phase interpolator 925.

The first determination circuit 911 samples a received signal DATA, transmitted from the transmitter 901 via the transmission line 902, near the transition edge of the received signal DATA on the rise edge or the fall edge of a first clock CK1 generated by the CDR. The first determination circuit 911 outputs, to the phase detector 921 via the first demultiplexer 913, a boundary sample signal indicating a phase relationship between the transition edge of the received signal DATA and the rise edge or the fall edge of the first clock CK1.

The second determination circuit 912 samples the received signal DATA, transmitted from the transmitter 901 via the transmission line 902, on the rise edge or the fall edge of a second clock CK2 which is different in phase by $\pi$ from the first clock CK1. The second determination circuit 912 outputs a data sample signal to the logic circuit 904, which is, for example, a CPU, and the phase detector 921 via the second demultiplexer 914. The data sample signal indicates the DATA value.

The bang-bang phase detector 921 compares the signal value corresponding to the boundary sample signal with the signal value corresponding to the data sample signal, and outputs a one-bit binary signal indicating whether the phase of the first clock CK1 is leading or lagging. The loop filter 922 outputs, to the phase offset circuit 923 and the first phase interpolator 924, a phase control code signal in accordance with the one-bit binary signal received from the phase detector 921. The first phase interpolator 924 adjusts the phase of a reference clock REF in accordance with the phase control code signal, and generates the first clock CK1. The second phase interpolator 925 adjusts the phase of the reference clock REF in accordance with the phase control code signal of which the phase is changed by $\pi$ by the phase offset circuit 923, and generates the second clock CK2.

The bang-bang phase detector 921 outputs a one-bit binary signal. Therefore, the CDR circuit 915 may be formed without use of a large scale circuit such as a multiplying circuit, resulting in a characteristic in that the CDR circuit 915 is easily integrated.

Figure 2:
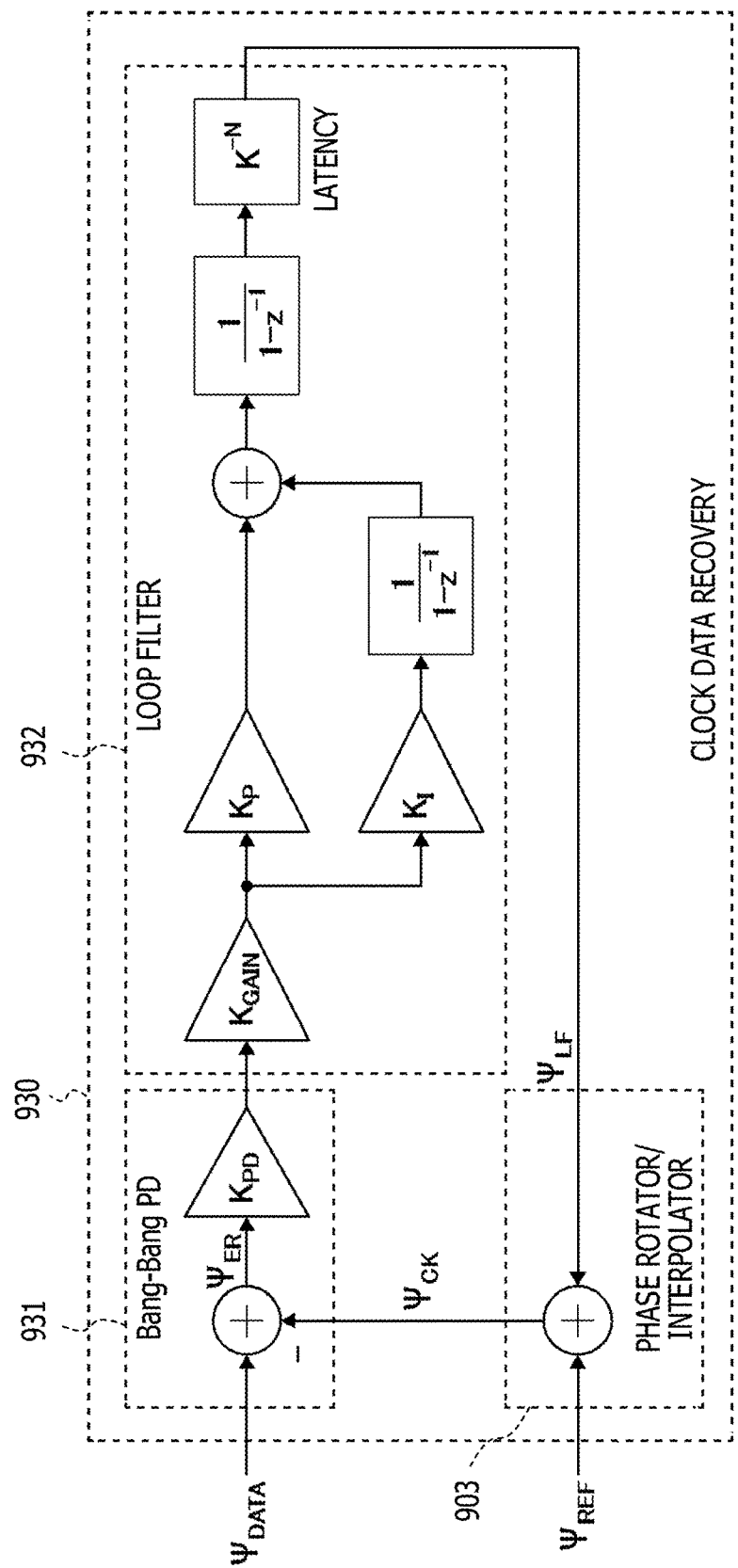
FIG. 2 is a diagram illustrating an exemplary equivalent circuit of the clock and data recovery (CDR) circuit illustrated in FIG. 1.

FIG. 2 illustrates an exemplary equivalent circuit of the CDR circuit.

An equivalent circuit 930 includes a bang-bang phase detector 931, a loop filter 932, and a feedback unit 933. The phase detector 931 corresponds to the phase detector 921; the loop filter 932 corresponds to the loop filter 922; and the feedback unit 933 corresponds to the phase offset circuit 923, the first phase interpolator 924, and the second phase interpolator 925.

In FIG. 2, $\psi_{ER}$ indicates the tracking error in the CDR circuit 915; $\psi_{DATA}$ indicates jitter on the received signal DATA; and $\psi_{REF}$ indicates jitter on the reference clock REF. In addition, $\psi_{LF}$ indicates jitter on the output signal from the loop filter 932, and $\psi_{CK}$ indicates jitter on the output signal from the feedback unit 933. The symbol $K_{PD}$ indicates the gain of the phase detector 931, and $K_{LF}$ indicates the entire gain of the loop filter 932.

The tracking error $\psi_{ER}$ is expressed by using the jitter $\psi_{DATA}$ on the received signal DATA, the jitter $\psi_{REF}$ on the reference clock REF, the gain $K_{PD}$ of the phase detector 931, and the entire gain $K_{LF}$ of the loop filter 932.

$$\psi_{ER} = \frac{\psi_{DATA} - \psi_{REF}}{1 + K_{PD} K_{LF}} \quad (1)$$

As illustrated in Expression (1), the larger the gain $K_{PD}$ of the phase detector 931 and the entire gain $K_{LF}$ of the loop filter 932 are, the smaller the tracking error $\psi_{ER}$ is.

Figure 3A:
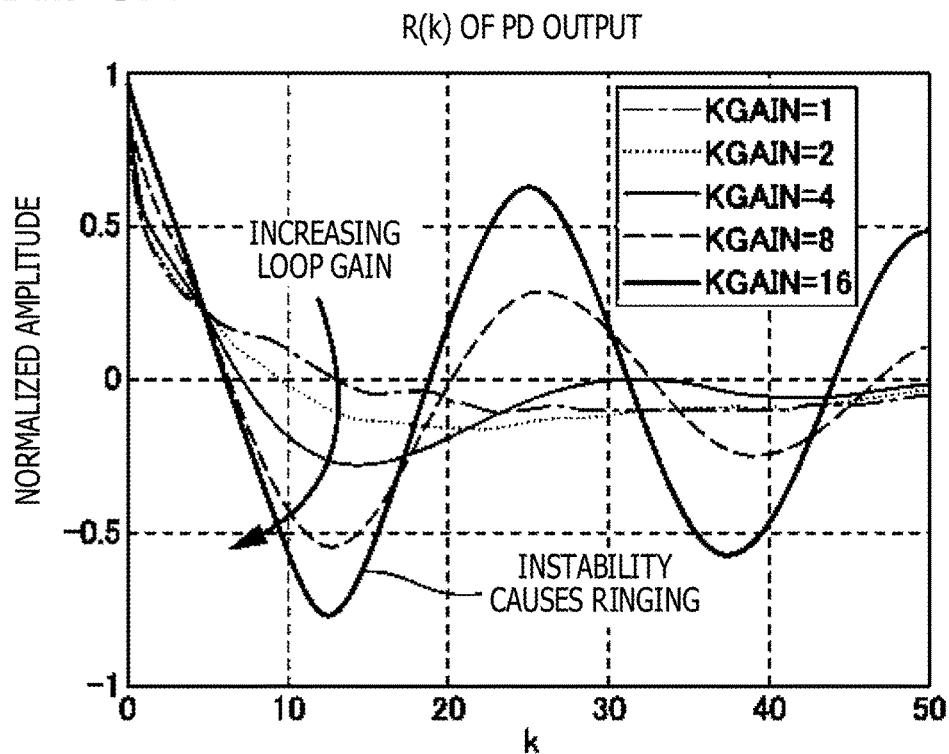
FIG. 3A is a diagram illustrating an exemplary relationship between a delay amount and an autocorrelation value.
Figure 3B:
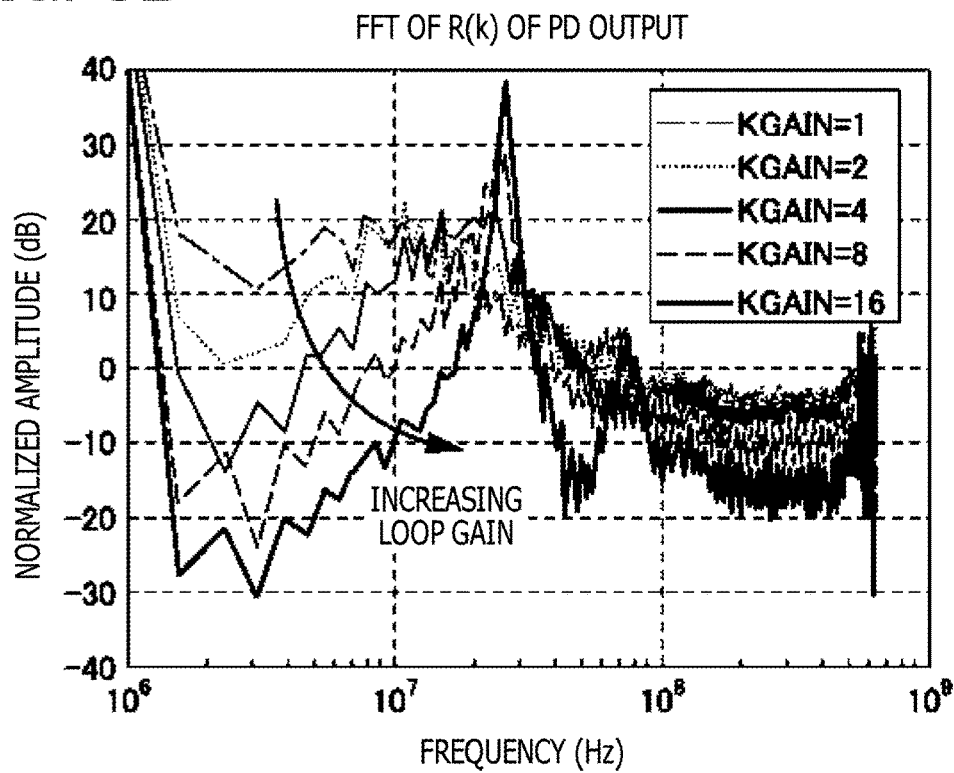
FIG. 3B is a diagram illustrating an exemplary relationship between an operating frequency and an autocorrelation value, which is illustrated in FIG. 3A.

For example, the gain $K_{PD}$ of the phase detector 931 which outputs a one-bit binary signal indicating "0" or "1" changes in accordance with the operating environment such as jitter of the received signal DATA. When the gain $K_{PD}$ of the phase detector 931 is more than a given value, as illustrated in FIGS. 3A and 3B, the response from the control loop oscillates, resulting in a reduction in accuracy in data reception. In FIG. 3A, the horizontal axis represents the delay amount k, and the vertical axis represents the autocorrelation value R(k) with respect to the delay amount k. In FIG. 3B, the horizontal axis represents the operating frequency of the CDR circuit 915, and the vertical axis represents the result obtained through fast Fourier transform (FFT) on the autocorrelation value R(k).

For example, even when the gain of a bang-bang phase detector changes in accordance with the operating environment such as jitter on a received data, a clock generating circuit may inhibit a state in which the response from the change control loop oscillates.

Figure 4:
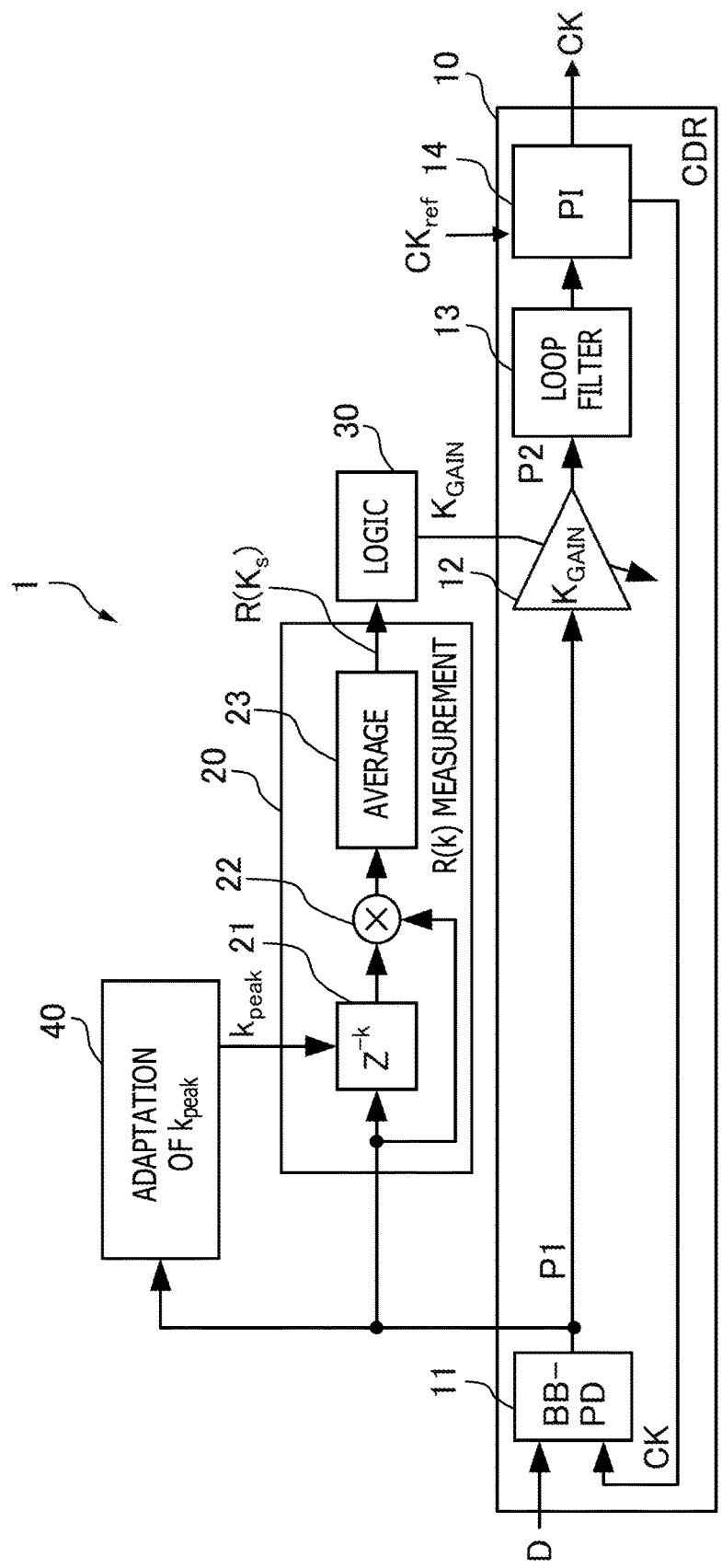
FIG. 4 is a diagram illustrating an exemplary clock generating circuit.

The Configuration and Function of a Clock Generating Circuit According to a First Embodiment FIG. 4 illustrates an exemplary clock generating circuit.

A clock generating circuit 1 includes a CDR circuit 10, an autocorrelation circuit 20, a gain adjusting circuit 30, and a delay-amount determination circuit 40.

The CDR circuit 10 includes a phase detector 11, a signal amplifying circuit 12, a loop filter 13, and a phase interpolator 14.

The phase detector 11 is a bang-bang circuit that receives a data signal D and a clock CK and that outputs a first phase detection signal P1 which is a one-bit binary signal indicating whether the phase of the clock CK is leading or lagging the phase of the data signal D. The data signal D includes the boundary sample signal and the data sample signal. The boundary sample signal is a data signal obtained by sampling the timing of the transition edge of the received data signal on the rise edge or the fall edge of the clock CK. The data sample signal is a data signal obtained by sampling the received data signal on the rise edge or the fall edge of a clock that is different in phase by $\pi$ from the clock CK. The signal amplifying circuit 12 receives the first phase detection signal P1 and a gain signal indicating a gain $K_{GAIN}$, amplifies the first phase detection signal P1 with the gain $K_{GAIN}$ corresponding to the gain signal, and outputs a second phase detection signal P2.

The configurations and operations of the loop filter 13 and the phase interpolator 14 may be, for example, known configurations and operations. The loop filter 13 and the phase interpolator 14 function as a control loop which adjusts, for output, the phase of the clock CK based on the second phase detection signal P2. The phase interpolator 14 adjusts the phase of a reference clock $CK_{ref}$, and outputs the clock CK to the phase detector 11 and an external circuit (not illustrated). The phase interpolator 14 may perform similar processes to those performed, for example, by the phase offset circuit 923, the first phase interpolator 924, and the second phase interpolator 925.

The autocorrelation circuit 20 includes a correlation variably-delaying circuit 21, a correlation multiplication circuit 22, and an averaging circuit 23. The correlation variably-delaying circuit 21 receives the first phase detection signal P1 and a set delay amount signal indicating a set delay amount $k_{peak}$, and delays the first phase detection signal P1 in accordance with the set delay amount $k_{peak}$. The correlation multiplication circuit 22 multiples the first phase detection signal P1 by the resulting signal obtained by the correlation variably-delaying circuit 21 delaying the first phase detection signal P1, and generates a multiplied signal. The averaging circuit 23 outputs a correlation signal indicating an autocorrelation value $R(k_s)$ obtained by averaging the multiplied signal values received from the multiplying circuit.

The gain adjusting circuit 30 adjusts the gain $K_{GAIN}$ corresponding to the gain signal so that the autocorrelation value $R(k_s)$ corresponding to the correlation signal matches a given target correlation value Ra. In this example, the given target correlation value Ra is zero. In addition, when the clock generating circuit 1 starts to operate, the gain adjusting circuit 30 sets the gain $K_{GAIN}$ corresponding to the gain signal to a given set gain. The set gain is a relatively large gain with which the autocorrelation value $R(k_z)$ changes in an oscillatory manner when the delay amount used in the correlation variably-delaying circuit 21 is gradually increased.

Figure 5:
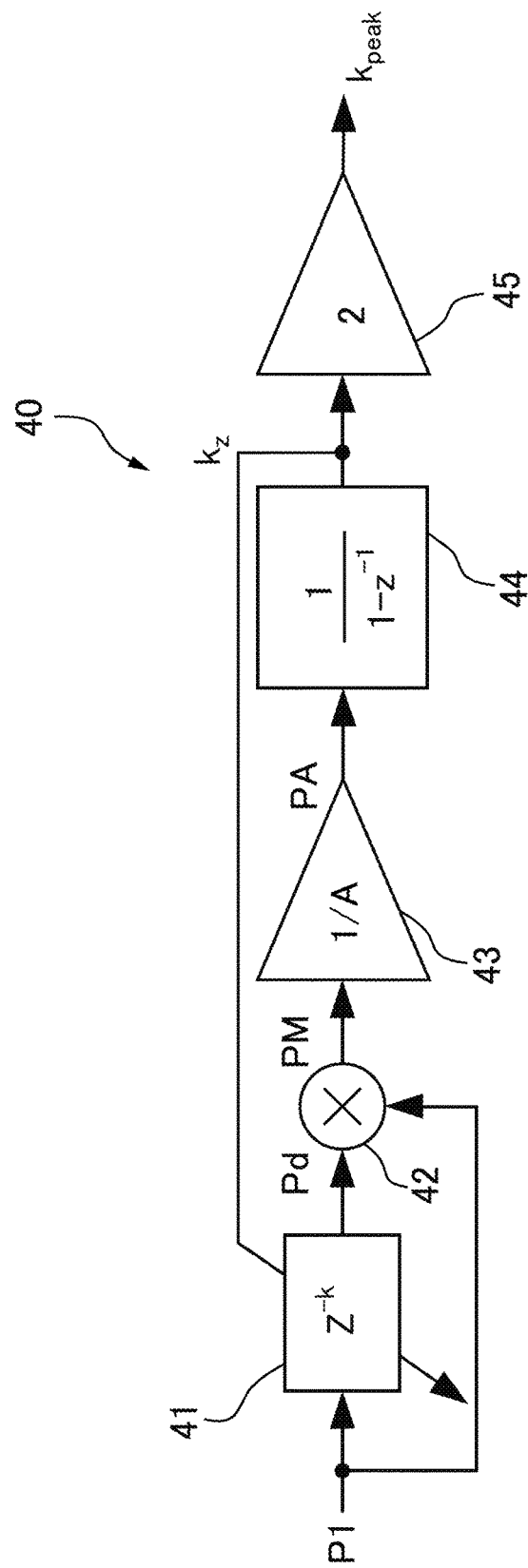
FIG. 5 is a diagram illustrating an exemplary internal circuit of the delay-amount determination circuit illustrated in FIG. 4.

FIG. 5 illustrates an exemplary internal circuit of the delay-amount determination circuit.

The delay-amount determination circuit 40 includes a variably-delaying circuit 41, a multiplying circuit 42, a first amplifying circuit 43, an integrating circuit 44, and a second amplifying circuit 45.

The variably-delaying circuit 41 receives the first phase detection signal P1 and a variable-delay-amount signal indicating a variable delay amount $k_z$, and delays the first phase detection signal P1 in accordance with the variable delay amount $k_z$. The multiplying circuit 42 multiplies the first phase detection signal P1 by the resulting signal obtained by the variably-delaying circuit 41 delaying the first phase detection signal P1, and outputs a multiplied signal PM. The first amplifying circuit 43 outputs a first amplified signal PA obtained by amplifying the multiplied signal PM by 1/A times. The integrating circuit 44 integrates the first amplified signal PA, and outputs, to the variably-delaying circuit 41 and the second amplifying circuit 45, the variable-delay-amount signal indicating the variable delay amount $k_z$. The variably-delaying circuit 41, the multiplying circuit 42, the first amplifying circuit 43, and the integrating circuit 44 form a zero-delay-amount searching circuit which controls the variable delay amount $k_z$ so that the first amplified signal PA received by the integrating circuit 44 becomes zero. The zero-delay-amount searching circuit is also called a zero-forcing feedback circuit.

Figure 6A:
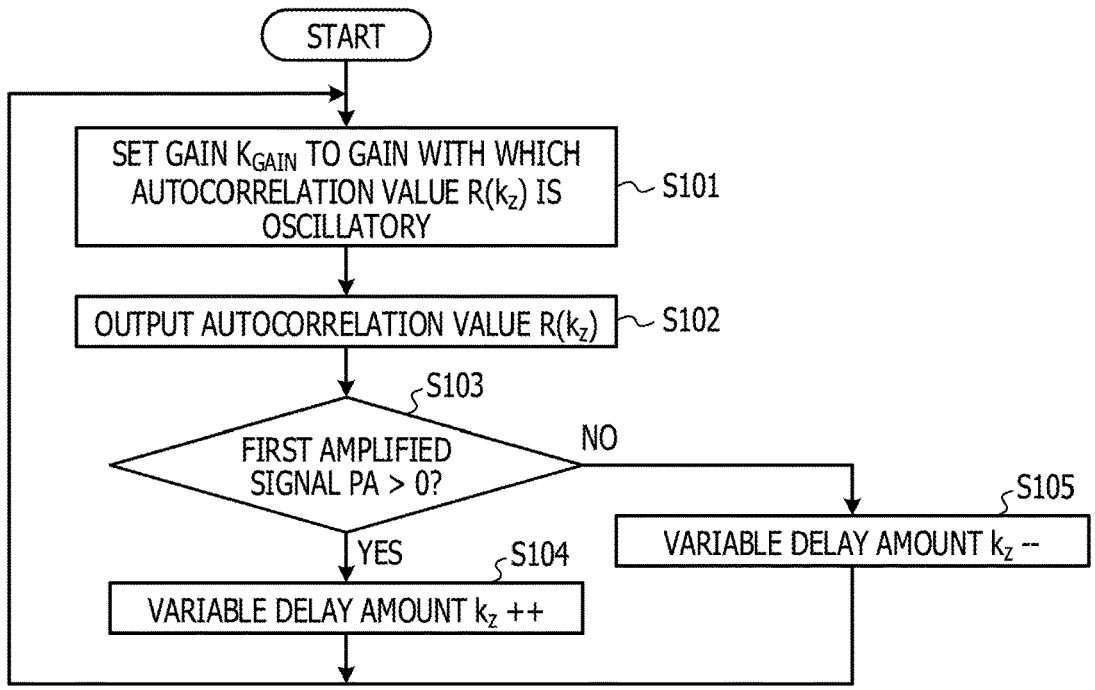
FIG. 6A is a diagram illustrating exemplary processes performed by a zero-forcing feedback circuit.
Figure 6B:
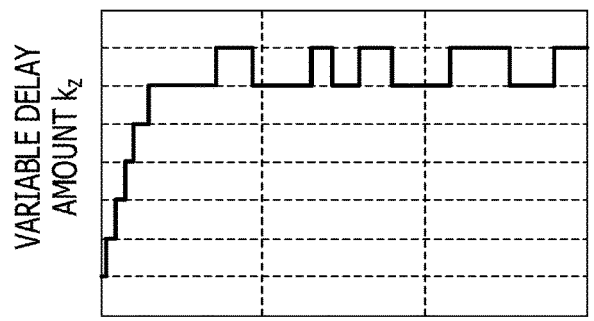
FIG. 6B is a diagram illustrating an exemplary change, with time, of a variable delay amount.
Figure 6C:
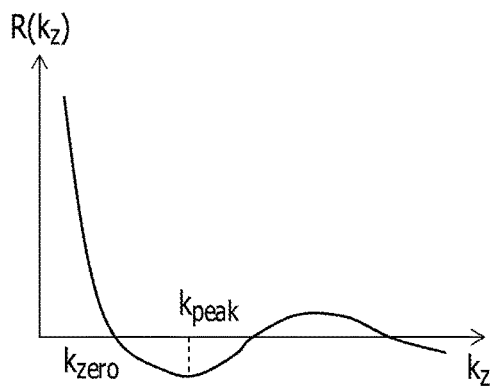
FIG. 6C is a diagram illustrating an exemplary relationship between a target value and a set delay amount.

FIG. 6A illustrates exemplary processes of the zero-forcing feedback circuit. FIG. 6A illustrates a flowchart of processes performed by the zero-forcing feedback circuit formed by the variably-delaying circuit 41, the multiplying circuit 42, the first amplifying circuit 43, and the integrating circuit 44. FIG. 6B illustrates an exemplary change, with time, of the variable delay amount. FIG. 6B illustrates a change, with time, of the variable delay amount $k_z$ corresponding to the variable delay signal which is output from the integrating circuit 44. FIG. 6C illustrates an exemplary relationship between a target value and the set delay amount.

FIG. 6C illustrates a relationship between the target value for which the zero-forcing feedback circuit controls the variable delay amount $k_z$, and the set delay amount $k_{peak}$ which is output by the delay-amount determination circuit 40 to the autocorrelation circuit 20. In FIG. 6B, the horizontal axis represents elapsed time, and the vertical axis represents the variable delay amount $k_z$. In FIG. 6C, the horizontal axis represents the variable delay amount $k_z$, and the vertical axis represents the autocorrelation value $R(k_z)$.

When the clock generating circuit 1 starts to operate, the gain adjusting circuit 30 sets the gain $K_{GAIN}$ corresponding to the gain signal, to a given set gain (S101). The set gain is a relatively large gain, with which the autocorrelation value $R(k_z)$ changes in an oscillatory manner when the delay amount for the correlation variably-delaying circuit 21 is gradually changed. Then, the zero-forcing feedback circuit outputs the variable delay amount $k_z$ in accordance with the first phase detection signal P1 received by the variably-delaying circuit 41 (S102). The feedback circuit adjusts the variable delay amount $k_z$ so that the first amplified signal PA becomes zero. That is, if the first amplified signal PA is above zero (YES in S103), the zero-forcing feedback circuit increments the variable delay amount $k_z$ which is output from the integrating circuit 44 (S104). In contrast, if the first amplified signal PA is below zero (NO in S103), the zero-forcing feedback circuit decrements the variable delay amount $k_z$ which is output from the integrating circuit 44 (S105).

As illustrated in FIG. 6B, when the clock generating circuit 1 starts to operate, the zero-forcing feedback circuit gradually increases the variable delay amount $k_z$ so that the first amplified signal PA becomes zero. When the first amplified signal PA approaches zero, the variable delay amount $k_z$ is controlled so that the variable delay amount $k_z$ remains at an approximately constant value. The first amplified signal PA is proportional to the multiplied signal PM obtained through multiplying the first phase detection signal P1 by the resulting value obtained by delaying the first phase detection signal P1 in accordance with the variable delay amount $k_z$. Therefore, when the first amplified signal PA approaches zero, the autocorrelation value $R(k_z)$ approaches zero. For example, the zero-forcing feedback circuit exerts control so that the variable delay amount $k_z$ matches a zero delay amount $k_{zero}$ for which the autocorrelation value $R(k_z)$ is zero.

The second amplifying circuit 45 is a delay-amount determination circuit which outputs the set delay amount signal indicating the set delay amount $k_{peak}$ obtained by doubling the variable delay amount $k_z$ corresponding to the variable-delay-amount signal received from the zero-forcing feedback circuit. The set delay amount $k_{peak}$ is approximately twice the zero delay amount $k_{zero}$ which is the first value for which the autocorrelation value $R(k_z)$ is zero when the autocorrelation value $R(k_z)$ changes in an oscillatory manner. Therefore, the set delay amount $k_{peak}$ is a delay amount corresponding to the first negative peak value of the autocorrelation value when the autocorrelation value $R(k_z)$ changes in an oscillatory manner.

The clock generating circuit 1 adjusts the gain $K_{GAIN}$ so that the autocorrelation value $R(k_{peak})$ for the set delay amount $k_{peak}$ becomes zero. The set delay amount $k_{peak}$ is a delay amount which corresponds to the first negative peak value of the autocorrelation value when the autocorrelation value $R(k_z)$ changes in an oscillatory manner. The clock generating circuit 1 adjusts the gain $K_{GAIN}$ so that the autocorrelation value $R(k_{peak})$ for the set delay amount $k_{peak}$ becomes zero. Thus, the clock generating circuit 1 may narrow the width of the autocorrelation value $R(k_{peak})$ as much as possible within the range in which the autocorrelation value $R(k_{peak})$ is not oscillatory, and may broaden the bandwidth of the control loop of the clock generating circuit 1. That is, the clock generating circuit 1 adjusts the gain $K_{GAIN}$ so that the autocorrelation value $R(k_{peak})$ for the set delay amount $k_{peak}$ which is a delay amount corresponding to the first negative peak value becomes zero. Thus, the clock generating circuit 1 narrows the width of the autocorrelation value $R(k_{peak})$ as much as possible within the range in which the autocorrelation value $R(k_{peak})$ is not oscillatory.

The clock generating circuit 1 doubles the variable delay amount $k_z$ which is the first value for which the autocorrelation value $R(k_z)$ is zero. Thus, the clock generating circuit 1 determines the set delay amount $k_{peak}$ which is a delay amount corresponding to the first negative peak value. Therefore, the clock generating circuit 1 may relatively easily determine the set delay amount $k_{peak}$.

Figure 7A:
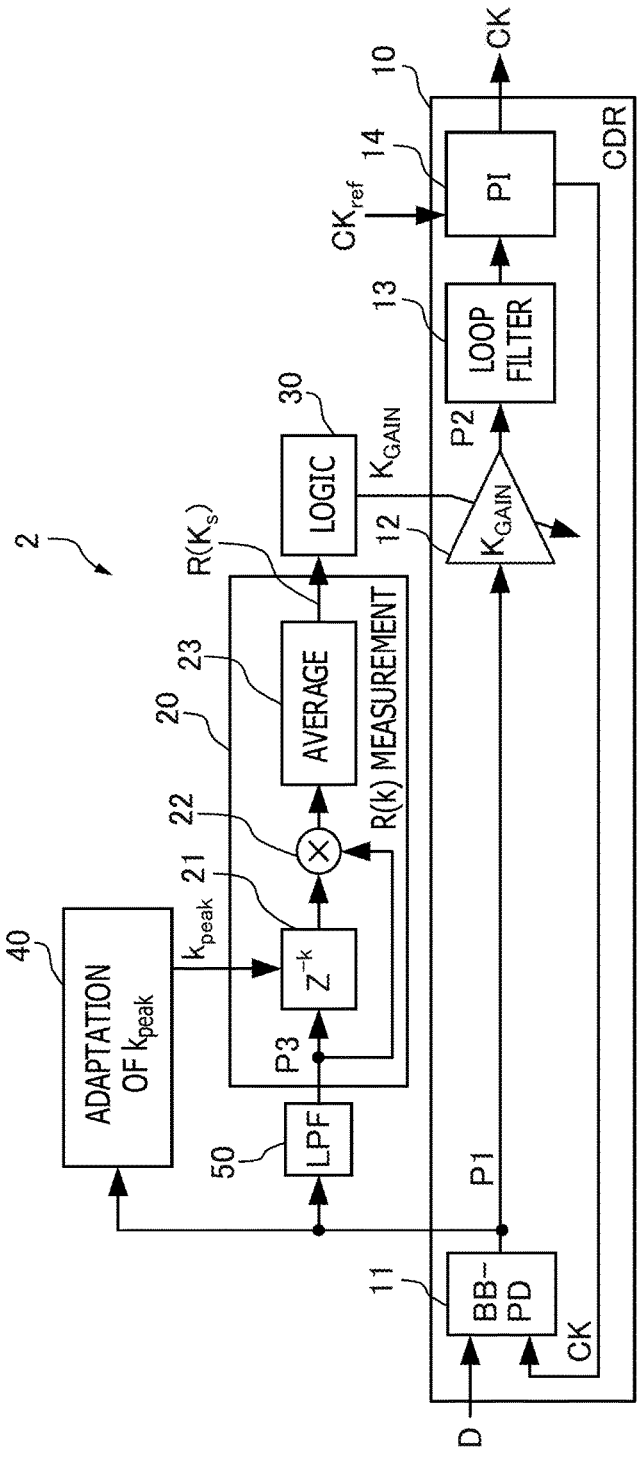
FIG. 7A is a diagram illustrating an exemplary clock generating circuit.
Figure 7B:
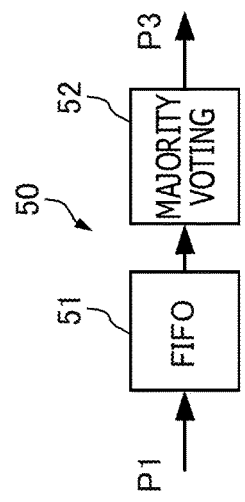
FIG. 7B is a diagram illustrating an exemplary internal circuit of the low-pass filter illustrated in FIG. 7A.

FIG. 7A illustrates an exemplary clock generating circuit. FIG. 7B illustrates an exemplary internal circuit of the low-pass filter illustrated in FIG. 7A.

A clock generating circuit 2 is different from the clock generating circuit 1 in that a low-pass filter 50 is disposed between the phase detector 11 and the autocorrelation circuit 20. The configurations and functions of the components, other than the low-pass filter 50, of the clock generating circuit 2 are the same as those of the components of the clock generating circuit 1 which are designated with the same reference numerals, and will not be described in detail.

The low-pass filter 50 includes a first-in, first-out (FIFO) 51 and a majority voting circuit 52. The FIFO 51 sequentially stores first phase detection signal P1 values, the number of which is equal to M, received from the phase detector 11, and outputs the first phase detection signal P1 values to the majority voting circuit 52 in the input order.

The majority voting circuit 52 stores the first phase detection signal P1 values, the number of which is equal to M, an odd number, and which are sequentially received from the FIFO 51. The majority voting circuit 52 compares the number of first phase detection signal P1 values, among the M first phase detection signal P1 values, indicating the leading state, with the number of first phase detection signal P1 values indicating the lagging state. The majority voting circuit 52 determines, based on the comparison result, whether the leading state or the lagging state is indicated. The majority voting circuit 52 outputs, to the autocorrelation circuit 20, a third phase detection signal P3 which is a one-bit binary signal indicating the determination result. When the number of first phase detection signal P1 values indicating the leading state is larger than the number of first phase detection signal P1 values indicating the lagging state, the majority voting circuit 52 outputs, to the autocorrelation circuit 20, the third phase detection signal P3 indicating the leading state. In contrast, when the number of first phase detection signal P1 values indicating the leading state is smaller than the number of first phase detection signal P1 values indicating the lagging state, the majority voting circuit 52 outputs, to the autocorrelation circuit 20, the third phase detection signal P3 indicating the lagging state.

The clock generating circuit 2 determines whether the leading state or the lagging state is indicated based on M first phase detection signal P1 values. Therefore, a kind of moving average is obtained for the window width of M values. Accordingly, high-frequency components included in the first phase detection signal P1 may be removed. Removing high-frequency components from the first phase detection signal P1 may cause the clock generating circuit 2 to exert stable control for adjusting the gain $K_{GAIN}$ for the signal amplifying circuit 12 so that the autocorrelation value $R(k_{peak})$ matches the target correlation value Ra, for example, the autocorrelation value $R(k_{peak})$ becomes zero.

Figure 8A:
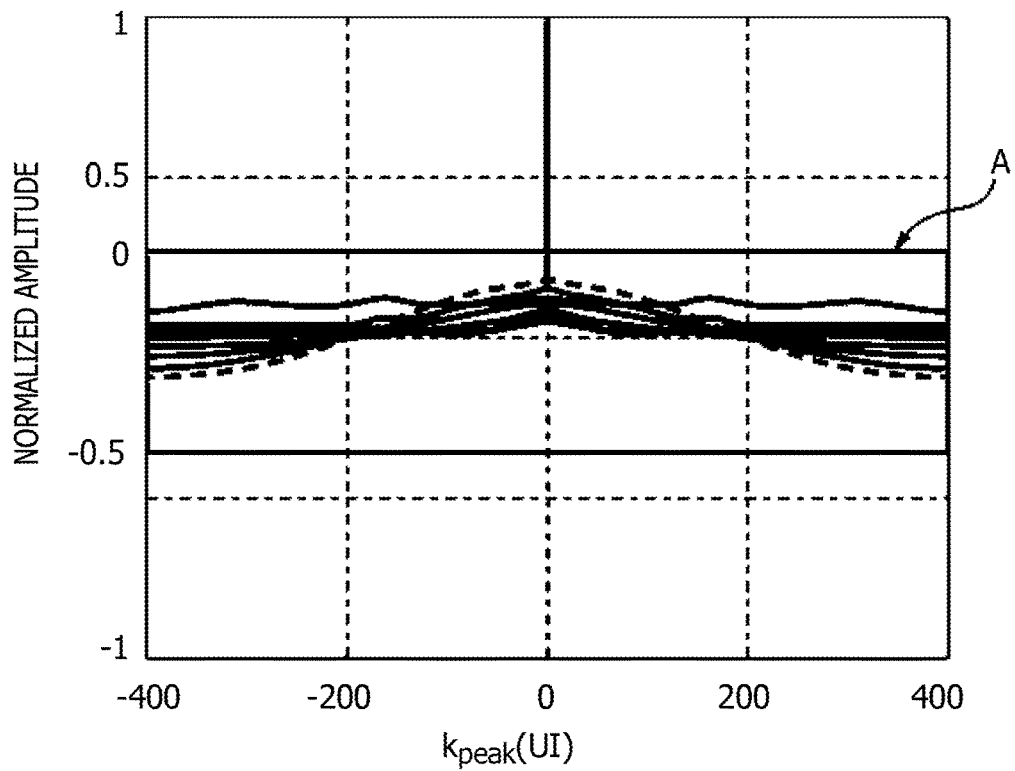
FIG. 8A is a diagram illustrating an exemplary relationship between a set delay amount and an autocorrelation value.
Figure 8B:
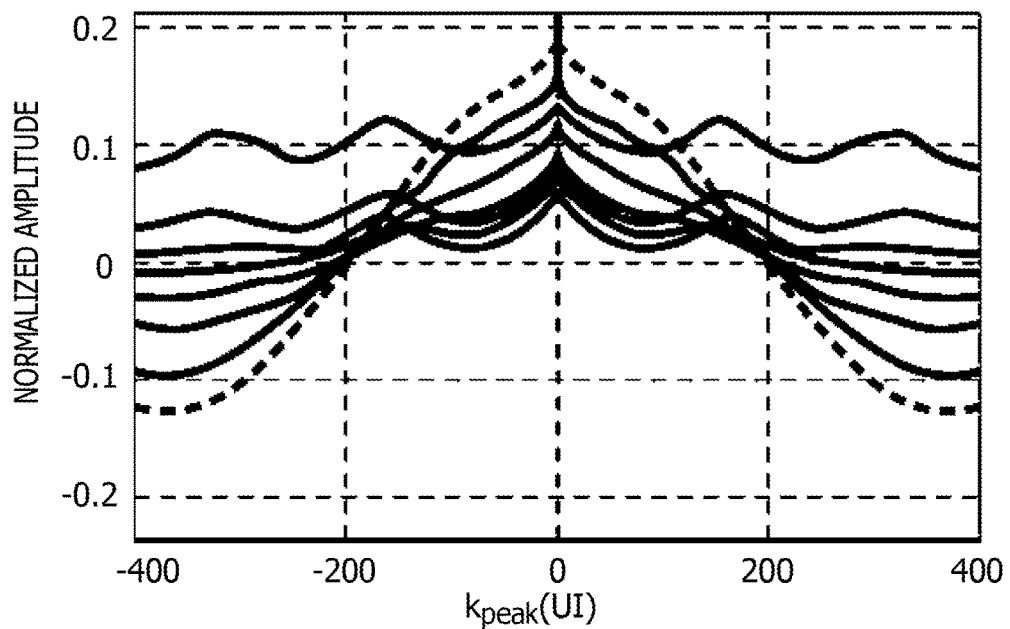
FIG. 8B is a diagram illustrating exemplary elements, on larger scale, of FIG. 8A.

FIG. 8A illustrates an exemplary relationship between the set delay amount and the autocorrelation value. FIG. 8B illustrates exemplary elements, on larger scale, of FIG. 8A. FIG. 8A illustrates the relationship, between the set delay amount $k_{peak}$ and the autocorrelation value $R(k_{peak})$, which is obtained when, in the clock generating circuit 2 illustrated in FIG. 7A, the gain $K_{GAIN}$ for the signal amplifying circuit 12 is changed. FIG. 8B illustrates elements, on larger scale, which are obtained by enlarging the area indicated by the arrow A in FIG. 8A. In FIGS. 8A and 8B, the horizontal axis represents the variable delay amount $k_z$ on the unit interval base, and the vertical axis represents the normalized autocorrelation value $R(k_z)$.

As illustrated in FIGS. 8A and 8B, by using the third phase detection signal P3 from which high-frequency components have been removed, even when the gain $K_{GAIN}$ for the signal amplifying circuit 12 is changed, the autocorrelation value $R(k_{peak})$ smoothly changes in accordance with the set delay amount $k_{peak}$. Since the autocorrelation value $R(k_{peak})$ smoothly changes in accordance with the set delay amount $k_{peak}$, the clock generating circuit 2 may exert stable control for making adjustments so that the autocorrelation value $R(k_{peak})$ matches the target correlation value Ra, for example, the autocorrelation value $R(k_{peak})$ becomes zero.

The third phase detection signal P3 which is output from the majority voting circuit 52 is a one-bit binary signal. Therefore, without use of a multiplier with a relatively large circuit scale, the correlation multiplication circuit 22 may use simple exclusive OR.

Figure 9:
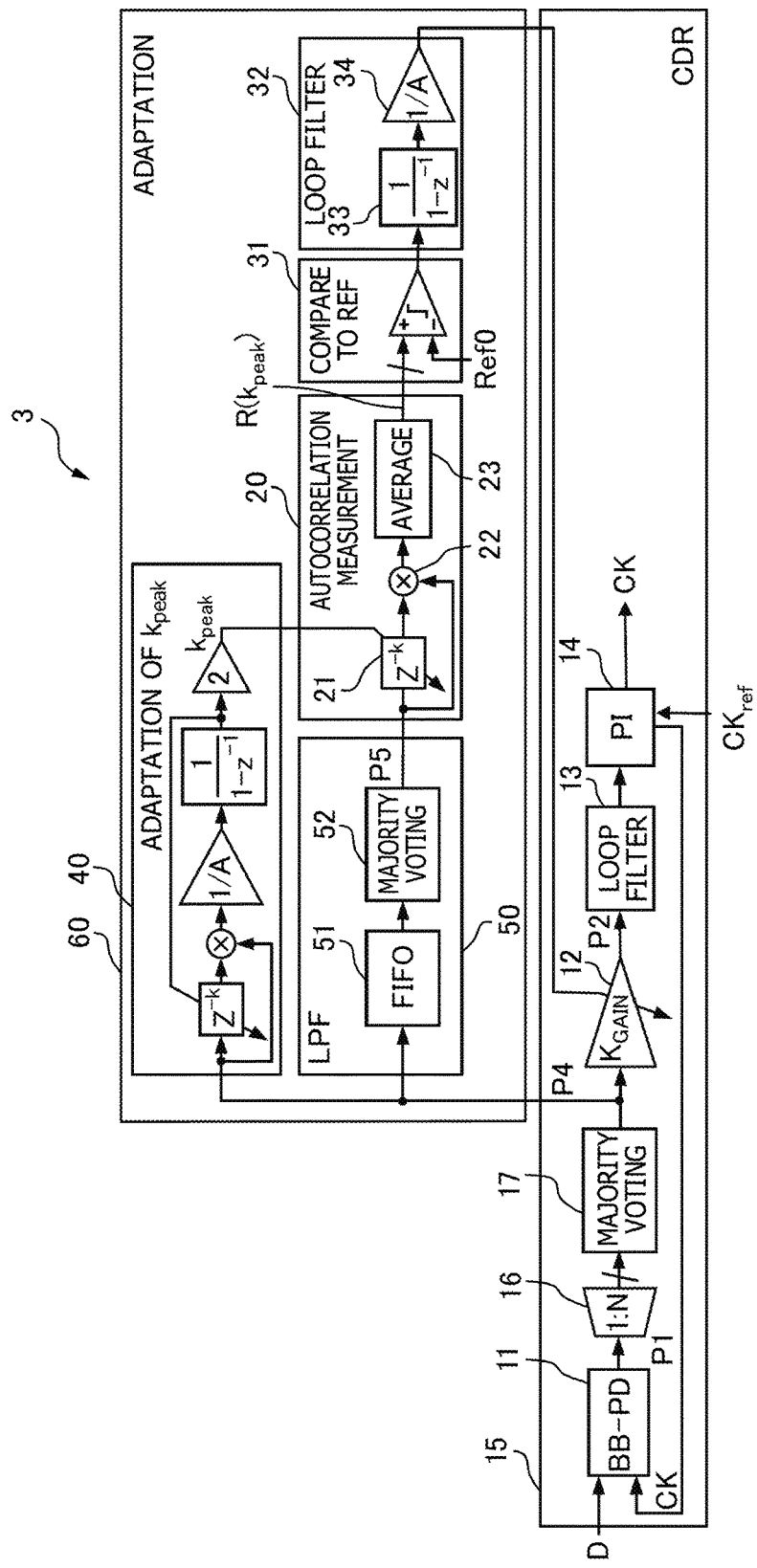
FIG. 9 is a diagram illustrating an exemplary clock generating circuit.

FIG. 9 illustrates an exemplary clock generating circuit.

A clock generating circuit 3 includes a CDR circuit 15 and an adapting circuit 60.

The CDR circuit 15 is different from the CDR circuit 10 in that a demultiplexer 16 and a majority voting circuit 17 are disposed between the phase detector 11 and the signal amplifying circuit 12. The configurations and functions of the components, other than the demultiplexer 16 and the majority voting circuit 17, of the CDR circuit 15 are the same as those of the components of the CDR circuit 10 which are designated with the same reference numerals, and will not be described in detail.

The demultiplexer 16 outputs, to the majority voting circuit 17 in parallel, first phase detection signal P1 values of N bits that are serially received. The majority voting circuit 17 compares the number of first phase detection signal P1 values, among the first phase detection signal P1 values of N bits which are input in parallel, indicating the leading state, with the number of first phase detection signal P1 values indicating the lagging state, and determines whether the leading state or the lagging state is indicated based on the comparison result. The majority voting circuit 17 outputs, to the signal amplifying circuit 12 and the adapting circuit 60, a fourth phase detection signal P4 which is a one-bit binary signal indicating the determination result. When the number of first phase detection signal P1 values indicating the leading state is larger than the number of first phase detection signal P1 values indicating the lagging state, the majority voting circuit 17 outputs, to the signal amplifying circuit 12 and the adapting circuit 60, the fourth phase detection signal P4 indicating the leading state. In contrast, when the number of first phase detection signal P1 values indicating the leading state is smaller than the number of first phase detection signal P1 values indicating the lagging state, the majority voting circuit 17 outputs, to the signal amplifying circuit 12 and the adapting circuit 60, the fourth phase detection signal P4 indicating the lagging state.

The adapting circuit 60 includes the autocorrelation circuit 20, an autocorrelation-value comparing circuit 31, an adaptive loop filter 32, the delay-amount determination circuit 40, and the low-pass filter 50. The configurations and functions of the autocorrelation circuit 20, the delay-amount determination circuit 40, and the low-pass filter 50 are already described in detail, and will not be described in detail. The autocorrelation-value comparing circuit 31 and the adaptive loop filter 32 have similar functions to those of the gain adjusting circuit 30.

The autocorrelation-value comparing circuit 31 compares the autocorrelation value $R(k_{peak})$ with an autocorrelation-value threshold Ref0, and outputs, to the adaptive loop filter 32, a comparison result signal indicating the comparison result. The autocorrelation-value threshold Ref0 is a value closest to zero, that is, approximately zero. When the autocorrelation value $R(k_{peak})$ is less than the autocorrelation-value threshold Ref0, the autocorrelation-value comparing circuit 31 determines that the autocorrelation value $R(k_{peak})$ becomes zero.

The adaptive loop filter 32 includes an adaptively-integrating circuit 33 and an adaptively-amplifying circuit 34. The adaptive loop filter 32 operates in a similar way to the zero-forcing feedback circuit described by referring to FIGS. 6A to 6C, and controls the gain $K_{GAIN}$ for the signal amplifying circuit 12 so that the autocorrelation value $R(k_{peak})$ becomes zero.

When the clock generating circuit 3 starts to operate, the adaptive loop filter 32 gradually increases the gain $K_{GAIN}$ for the signal amplifying circuit 12 from zero until the autocorrelation value $R(k_{peak})$ is less than the autocorrelation-value threshold Ref0. When the autocorrelation value $R(k_{peak})$ is less than the autocorrelation-value threshold Ref0, the autocorrelation-value comparing circuit 31 determines that the autocorrelation value $R(k_{peak})$ becomes zero, and outputs, to the adaptive loop filter 32, a zero determination signal indicating that the autocorrelation value $R(k_{peak})$ becomes zero. Upon reception of the zero determination signal, the adaptive loop filter 32 retains the $K_{GAIN}$ for controlling the gain for the signal amplifying circuit 12. After that, until the autocorrelation-value comparing circuit 31 cancels the zero determination signal output (until the autocorrelation value $R(k_{peak})$ exceeds the autocorrelation-value threshold Ref0), the adaptive loop filter 32 continuously outputs the retained $K_{GAIN}$ value.

In the clock generating circuit 3, the CDR circuit 15 includes the demultiplexer 16 and the majority voting circuit 17. Therefore, the operating frequency may be decreased in accordance with the number of bits subjected to serial-parallel conversion performed by the demultiplexer 16.

The clock generating circuit 3 may use the autocorrelation-value comparing circuit 31 and the adaptive loop filter 32 which have relatively small circuit scales, so as to implement the process in which the gain $K_{GAIN}$ is adjusted so that the autocorrelation value $R(k_{peak})$ becomes zero.

Figure 10:
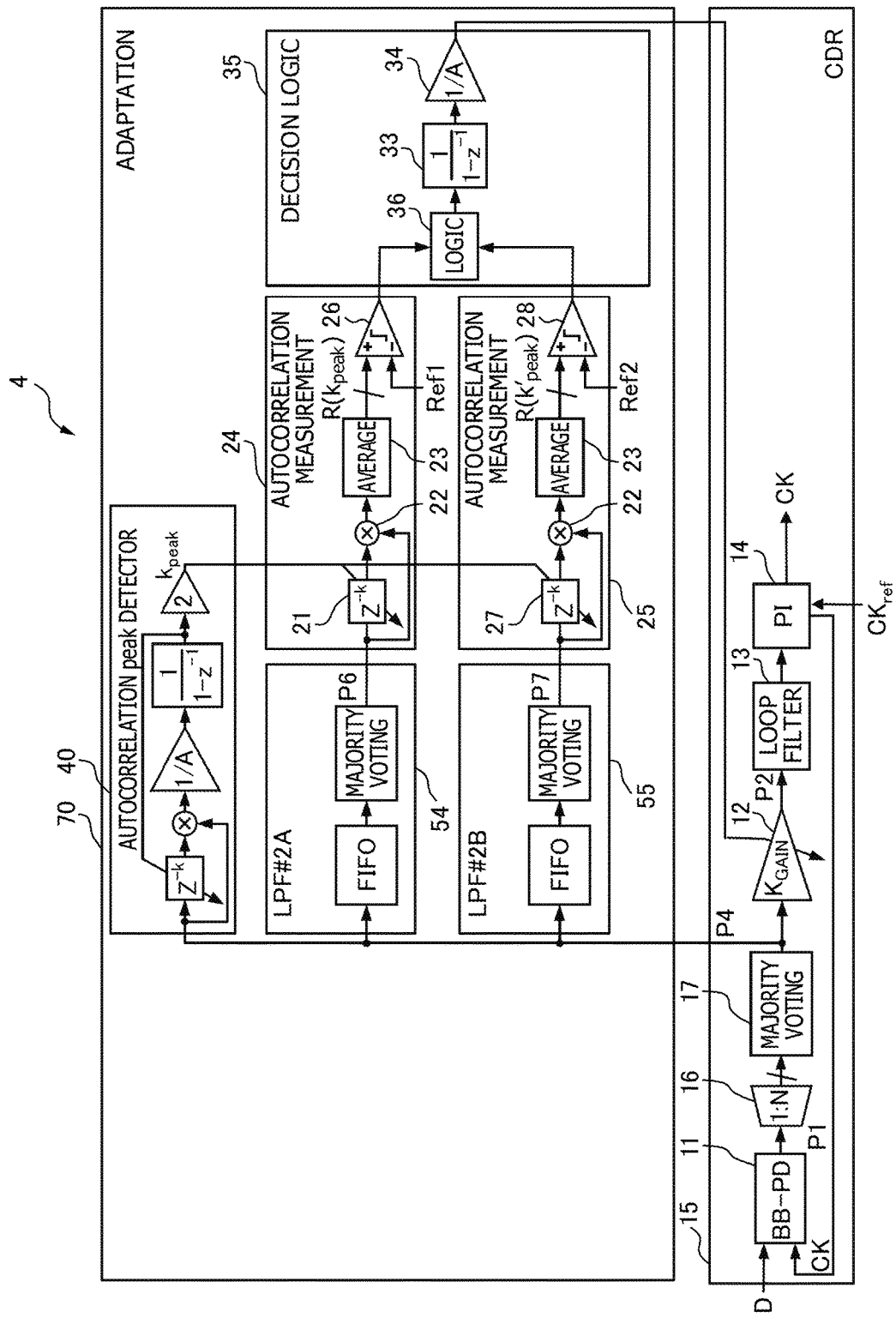
FIG. 10 is a diagram illustrating an exemplary clock generating circuit.

FIG. 10 illustrates an exemplary clock generating circuit.

A clock generating circuit 4 is different from the clock generating circuit 3 in that an adapting circuit 70 is disposed instead of the adapting circuit 60. The adapting circuit 70 includes a first autocorrelation circuit 24, a second autocorrelation circuit 25, a gain determination circuit 35, the delay-amount determination circuit 40, a first low-pass filter 54, and a second low-pass filter 55. The configurations and functions of the CDR circuit 15 and the delay-amount determination circuit 40 are already described, and will not be described in detail. The configurations and functions of the first low-pass filter 54 and the second low-pass filter 55 are similar to those of the low-pass filter 50, and will not be described in detail. The first low-pass filter 54 outputs, to the first autocorrelation circuit 24, a sixth phase detection signal P6 indicating whether the leading state or the lagging state is indicated. The second low-pass filter 55 outputs, to the second autocorrelation circuit 25, a seventh phase detection signal P7 indicating the leading state or the lagging state.

The first autocorrelation circuit 24 is different from the autocorrelation circuit 20 in that a first autocorrelation-value comparing circuit 26 is included. The second autocorrelation circuit 25 is different from the autocorrelation circuit 20 in that a correlation variably-delaying circuit 27 is disposed instead of the correlation variably-delaying circuit 21 and in that a second autocorrelation-value comparing circuit 28 is included. The configurations and functions of the correlation variably-delaying circuit 21, the correlation multiplication circuit 22, and the averaging circuit 23 are already described, and will not be described in detail.

The first autocorrelation-value comparing circuit 26 compares the autocorrelation value $R(k_{peak})$ with a first autocorrelation-value threshold Ref1 which is variable, and outputs, to the gain determination circuit 35, a comparison result signal indicating the comparison result. The first autocorrelation-value threshold Ref1 is a value closest to zero, that is, approximately zero. When the autocorrelation value $R(k_{peak})$ is less than the first autocorrelation-value threshold Ref1, the first autocorrelation-value comparing circuit 26 determines that the autocorrelation value $R(k_{peak})$ becomes zero.

The correlation variably-delaying circuit 27 receives the seventh phase detection signal P7 and the set delay amount signal indicating the set delay amount $k_{peak}$, and delays the seventh phase detection signal P7 by a set delay amount $k'_{peak}$ obtained by adding a given offset amount to the set delay amount $k_{peak}$. The correlation multiplication circuit 22 multiplies the seventh phase detection signal P7 by the result obtained by the correlation variably-delaying circuit 27 delaying the seventh phase detection signal P7, and generates a multiplied signal. The averaging circuit 23 outputs a correlation signal indicating an autocorrelation value $R(k'_{peak})$ obtained by averaging the multiplied signal received from the multiplying circuit.

The second autocorrelation-value comparing circuit 28 compares the autocorrelation value $R(k'_{peak})$ with a second autocorrelation-value threshold Ref2 which is variable, and outputs, to the gain determination circuit 35, a comparison result signal indicating the comparison result. The second autocorrelation-value threshold Ref2 is a value closest to zero, that is, approximately zero. When the autocorrelation value $R(k'_{peak})$ is less than the second autocorrelation-value threshold Ref2, the second autocorrelation-value comparing circuit 28 determines that the autocorrelation value $R(k'_{peak})$ becomes zero.

The gain determination circuit 35 includes the adaptively-integrating circuit 33, the adaptively-amplifying circuit 34, and a weighting circuit 36. The adaptively-integrating circuit 33 and the adaptively-amplifying circuit 34 are already described, and will not be described in detail. The weighting circuit 36 adds, after weighting, the autocorrelation value $R(k_{peak})$ received from the first autocorrelation circuit 24, to the autocorrelation value $R(k'_{peak})$ received from the second autocorrelation circuit 25, and generates a weighted autocorrelation value $R_W(k_{peak})$. The weight values used in the weighted addition performed by the weighting circuit 36 may be changed.

When the clock generating circuit 4 starts to operate, the gain determination circuit 35 gradually increases the gain $K_{GAIN}$ for the signal amplifying circuit 12 from zero. When the autocorrelation value $R(k_{peak})$ is less than the first autocorrelation-value threshold Ref1, the first autocorrelation circuit 24 determines that the autocorrelation value $R(k_{peak})$ becomes zero, and outputs, to the gain determination circuit 35, a first zero determination signal indicating that the autocorrelation value $R(k_{peak})$ becomes zero. When the autocorrelation value $R(k'_{peak})$ less than the second autocorrelation-value threshold Ref2, the second autocorrelation circuit 25 determines that the autocorrelation value $R(k'_{peak})$ becomes zero, and outputs, to the gain determination circuit 35, a second zero determination signal indicating that the autocorrelation value $R(k'_{peak})$ becomes zero. Upon reception of both the first zero determination signal and the second zero determination signal, the gain determination circuit 35 retains the $K_{GAIN}$ for controlling the gain for the signal amplifying circuit 12. After that, until the first autocorrelation circuit 24 and the second autocorrelation circuit 25 cancel the first zero determination signal output and the second zero determination signal output (until the autocorrelation value $R(k_{peak})$ exceeds the autocorrelation-value threshold Ref1 or the autocorrelation value $R(k'_{peak})$ exceeds the autocorrelation-value threshold Ref1), the gain determination circuit 35 continuously outputs the retained $K_{GAIN}$ value.

The clock generating circuit 4 uses a weighted autocorrelation value obtained by adjusting, as appropriate in accordance with the operating environment, autocorrelation values obtained through computation using two autocorrelation circuits having different set delay amounts, achieving improvement of the activation speed of the CDR circuit 15.

Figure 11:
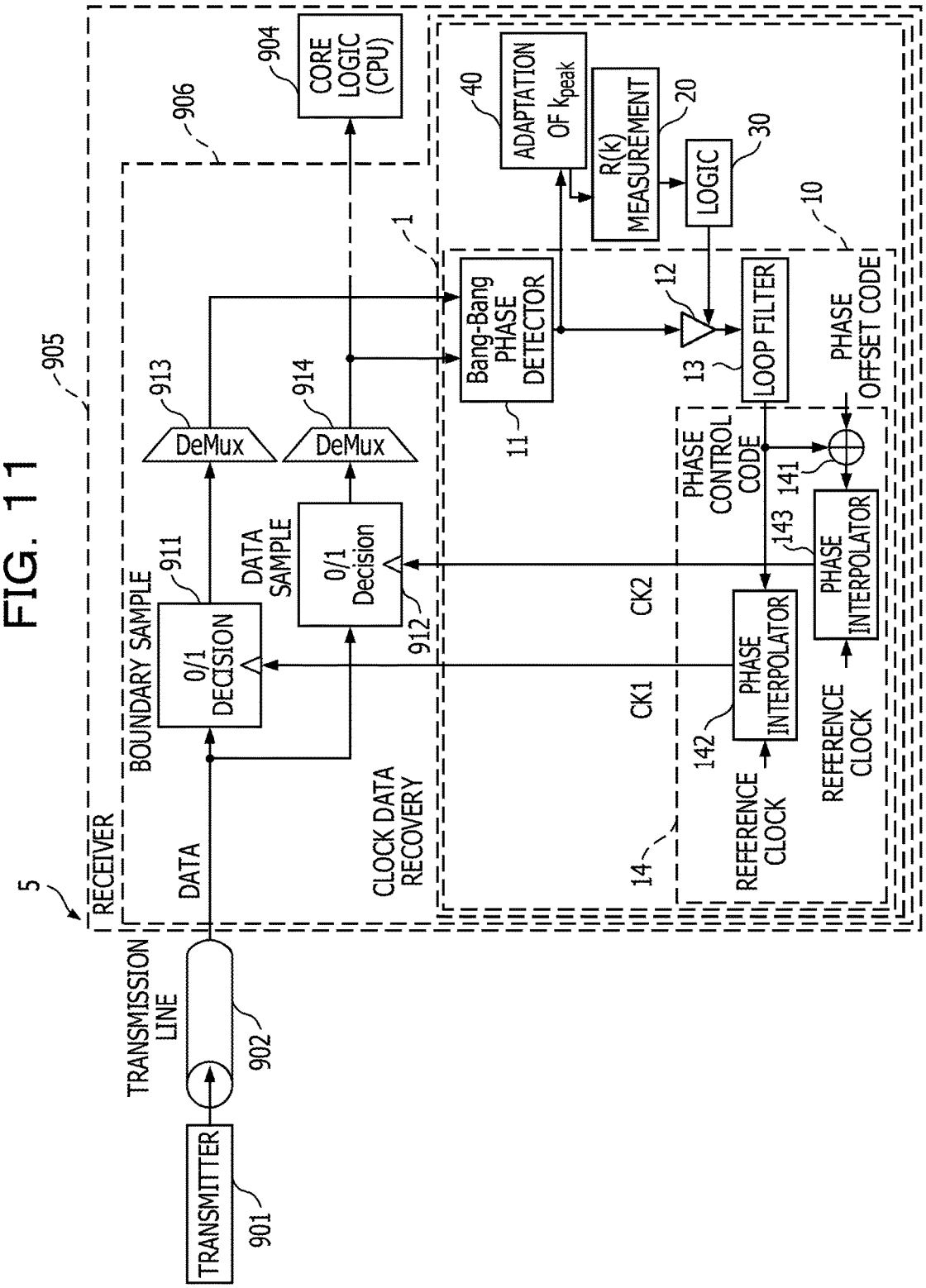
FIG. 11 is a diagram illustrating an exemplary communication system using a clock generating circuit.

FIG. 11 illustrates an exemplary circuit of a communication system using a clock generating circuit.

A communication system 5 includes the transmitter 901, the transmission line 902, a receiver 906, a receiving device 905 having the logic circuit 904 which is a CPU. The transmitter 901, the transmission line 902, and the logic circuit 904 are already described, and will not be described in detail. The logic circuit 904 is an information processing circuit that performs information processing in accordance with a received signal recovered by the receiver. The receiving device 905 is an information processing device that processes various information in accordance with a received signal.

The receiver 906 is a serial-parallel conversion circuit that converts, into parallel data, serial data received from the transmitter 901 via the transmission line 902. Each of the first determination circuit 911 and the second determination circuit 912 samples, with a corresponding clock, the received signal that is serially input, determines signal values corresponding to the data, and serially outputs a data signal indicating the determined signal values. The first demultiplexer 913 outputs, to the phase detector 11 in parallel, the data signal that is serially input. The second demultiplexer 914 outputs, to the phase detector 11 and the logic circuit 904 in parallel, the data signal that is serially input. The receiver 906 is different from the receiver 903 in that the clock generating circuit 1 is disposed instead of the CDR circuit 915. The configurations and functions of the components, other than the clock generating circuit 1, of the receiver 906 are substantially the same as those of the components of the receiver 903 which are designated with the same reference numerals, and will not be described in detail.

The phase interpolator 14 includes a phase offset circuit 141, a first phase interpolator 142, and a second phase interpolator 143. The phase offset circuit 141, the first phase interpolator 142, and the second phase interpolator 143 have substantially the same configurations and functions as those of the phase offset circuit 923, the first phase interpolator 924, and the second phase interpolator 925, respectively.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A serial-parallel conversion circuit comprising:
    a determination circuit that samples an input signal which is input serially with a clock signal, determines a signal value corresponding to the input signal, and serially outputs a data signal indicating the determined signal value;
    a demultiplexer that outputs the data signal which is input serially in parallel; and
    a clock generating circuit that generates the clock signal, wherein the clock generating circuit includes:
    a phase detector that outputs a first phase detection signal indicating whether a phase of the clock signal is advance or behind to the data signal;
    a signal amplifying circuit that receives the first phase detection signal and a gain signal indicating a gain, and amplifies the first phase detection signal with the gain so as to output a second phase detection signal;
    a control loop that adjusts the phase of the clock signal based on the second phase detection signal, and outputs the adjustment result to the phase detector;
    an autocorrelation circuit that generates an autocorrelation value based on the first phase detection signal and a set delay amount, and outputs an autocorrelation signal indicating the autocorrelation value;
    a gain adjusting circuit that adjusts the gain in such a manner that the autocorrelation value matches a target correlation value; and
    a delay-amount determination circuit that sets a delay amount corresponding to a peak value of an obtained autocorrelation value obtained when the autocorrelation value changes in an oscillatory manner in accordance with a change in a delay amount by which the first phase detection signal is delayed.

2. The serial-parallel conversion circuit according to claim 1,
    wherein the autocorrelation circuit includes:
    a variable delay circuit that receives, as a phase detection signal, one of the first phase detection signal and a third phase detection signal based on the first phase detection signal, receives a set delay amount signal indicating the set delay amount, and delays the first phase detection signal in accordance with the set delay amount;
    a correlation multiplication circuit that multiples the first phase detection signal by a delayed first phase detection signal which is delayed by the variable delay circuit, and that generates a correlation multiplication signal; and
    an averaging circuit that outputs an autocorrelation signal indicating an autocorrelation value obtained by averaging the correlation multiplication signal.

3. The serial-parallel conversion circuit according to claim 2, further comprising:
    a low-pass filter disposed between the phase detector and the autocorrelation circuit,
    wherein the low-pass filter includes:
    a majority voting circuit that stores a plurality of first phase detection signals over a period of the clock, and that compares, in the stored first phase detection signals, a number of first phase detection signal values indicating an advance state with a number of first phase detection signal values indicating a behind state, and outputs, based on the comparison result, the third phase detection signal indicating the advance state or the behind state.

4. The serial-parallel conversion circuit according to claim 1,
    wherein the target correlation value is zero.

5. The serial-parallel conversion circuit according to claim 1,
    wherein the delay-amount determination circuit determines a delay amount corresponding to a negative peak value of the autocorrelation value which is obtained first when the delay amount is gradually increased from zero.

6. The serial-parallel conversion circuit according to claim 1,
    wherein the delay-amount determination circuit includes:
    a zero-delay-amount searching circuit that searches for a delay amount for which the autocorrelation value first becomes zero when the delay amount is increased; and
    a set-delay-amount computation circuit that computes a delay amount for a signal delay unit by doubling the delay amount obtained through the search performed by the zero-delay-amount searching circuit.

7. The serial-parallel conversion circuit according to claim 6,
    wherein the zero-delay-amount searching circuit includes:
    a variable delay circuit that delays the first phase detection signal by a variable delay amount;
    a multiplying circuit that multiplies the first phase detection signal by the delayed first phase detection signal obtained by delaying the first phase detection signal by the variable delay circuit and outputs a multiplied signal;
    an amplifying circuit that amplifies the multiplied signal and outputs an amplified signal; and
    an integrating circuit that integrates signal values corresponding to the amplified signal, and that outputs, to the variable delay circuit and the set-delay-amount computation circuit, a variable-delay-amount signal indicating the variable delay amount.

8. The serial-parallel conversion circuit according to claim 1,
    wherein the gain adjusting circuit includes:
    an autocorrelation-value comparing circuit that determines whether or not the autocorrelation value becomes zero and
    an adaptive loop filter that adjusts the gain until the autocorrelation-value comparing circuit determines that the autocorrelation value becomes zero.

9. A clock generation circuit comprising:
a phase detector that outputs a first phase detection signal indicating whether a phase of the clock signal is advance or behind to the data signal;
a signal amplifying circuit that receives the first phase detection signal and a gain signal indicating a gain, and amplifies the first phase detection signal with the gain so as to output a second phase detection signal;
a control loop that adjusts the phase of the clock signal based on the second phase detection signal, and outputs the adjustment result to the phase detector;
an autocorrelation circuit that generates an autocorrelation value based on the first phase detection signal and a set delay amount, and outputs an autocorrelation signal indicating the autocorrelation value;
a gain adjusting circuit that adjusts the gain in such a manner that the autocorrelation value matches a target correlation value; and
a delay-amount determination circuit that sets a delay amount corresponding to a peak value of an obtained autocorrelation value obtained when the autocorrelation value changes in an oscillatory manner in accordance with a change in a delay amount by which the first phase detection signal is delayed.

10. The clock generation circuit according to claim 9, wherein the autocorrelation circuit includes:
a variable delay circuit that receives, as a phase detection signal, one of the first phase detection signal and a third phase detection signal based on the first phase detection signal, receives a set delay amount signal indicating the set delay amount, and delays the first phase detection signal in accordance with the set delay amount;
a correlation multiplication circuit that multiples the first phase detection signal by a delayed first phase detection signal which is delayed by the variable delay circuit, and that generates a correlation multiplication signal; and
an averaging circuit that outputs an autocorrelation signal indicating an autocorrelation value obtained by averaging the correlation multiplication signal.

11. The clock generation circuit according to claim 9, wherein the target correlation value is zero.

12. The clock generation circuit according to claim 9, wherein the delay-amount determination circuit determines a delay amount corresponding to a negative peak value of the autocorrelation value which is obtained first when the delay amount is gradually increased from zero.

13. The clock generation circuit according to claim 9, wherein the delay-amount determination circuit includes:
a zero-delay-amount searching circuit that searches for a delay amount for which the autocorrelation value first becomes zero when the delay amount is increased; and
a set-delay-amount computation circuit that computes a delay amount for a signal delay unit by doubling the delay amount obtained through the search performed by the zero-delay-amount searching circuit.

14. The clock generation circuit according to claim 9, wherein the gain adjusting circuit includes:
an autocorrelation-value comparing circuit that determines whether or not the autocorrelation value becomes zero and
an adaptive loop filter that adjusts the gain until the autocorrelation-value comparing circuit determines that the autocorrelation value becomes zero.

15. An information processing device comprising:
a receiver that receive an input signal; and
a processor that performs processing on the input signal, wherein the receiver includes:
a determination circuit that samples the input signal which is input serially with a clock signal, determines a signal value corresponding to the input signal, and serially outputs a data signal indicating the determined signal value;
a demultiplexer that outputs the data signal which is input serially in parallel; and
a clock generating circuit that generates the clock signal, wherein the clock generating circuit includes:
a phase detector that outputs a first phase detection signal indicating whether a phase of the clock signal is advance or behind to the data signal,
a signal amplifying circuit that receives the first phase detection signal and a gain signal indicating a gain, and amplifies the first phase detection signal with the gain so as to output a second phase detection signal;
a control loop that adjusts the phase of the clock signal based on the second phase detection signal, and outputs the adjustment result to the phase detector;
an autocorrelation circuit that generates an autocorrelation value based on the first phase detection signal and a set delay amount, and outputs an autocorrelation signal indicating the autocorrelation value;
a gain adjusting circuit that adjusts the gain in such a manner that the autocorrelation value matches a target correlation value; and
a delay-amount determination circuit that sets a delay amount corresponding to a peak value of an obtained autocorrelation value obtained when the autocorrelation value changes in an oscillatory manner in accordance with a change in a delay amount by which the first phase detection signal is delayed.

16. The information processing device according to claim 15,
wherein the autocorrelation circuit includes:
a variable delay circuit that receives, as a phase detection signal, one of the first phase detection signal and a third phase detection signal based on the first phase detection signal, receives a set delay amount signal indicating the set delay amount, and delays the first phase detection signal in accordance with the set delay amount;
a correlation multiplication circuit that multiples the first phase detection signal by a delayed first phase detection signal which is delayed by the variable delay circuit, and that generates a correlation multiplication signal; and
an averaging circuit that outputs an autocorrelation signal indicating an autocorrelation value obtained by averaging the correlation multiplication signal.

17. The information processing device according to claim 15,
wherein the target correlation value is zero.

18. The information processing device according to claim 15,
wherein the delay-amount determination circuit determines a delay amount corresponding to a negative peak value of the autocorrelation value which is obtained first when the delay amount is gradually increased from zero.

19. The information processing device according to claim 15,
wherein the delay-amount determination circuit includes:
a zero-delay-amount searching circuit that searches for a delay amount for which the autocorrelation value first becomes zero when the delay amount is increased; and a set-delay-amount computation circuit that computes a delay amount for a signal delay unit by doubling the delay amount obtained through the search performed by the zero-delay-amount searching circuit.

20. The information processing device according to claim 15,
wherein the gain adjusting circuit includes:
an autocorrelation-value comparing circuit that determines whether or not the autocorrelation value becomes zero and
an adaptive loop filter that adjusts the gain until the autocorrelation-value comparing circuit determines that the autocorrelation value becomes zero.

\* \* \* \* \*